United States Patent [19]
Gardner et al.

[11] Patent Number: 5,656,538
[45] Date of Patent: Aug. 12, 1997

[54] HALIDE DOPANT PROCESS FOR PRODUCING SEMI-INSULATING GROUP III-V REGIONS FOR SEMICONDUCTOR DEVICES

[75] Inventors: Nathan F. Gardner, Champaign, Ill.; Stephen A. Stockman, San Jose, Calif.; Quesnell J. Hartmann; Gregory E. Stillman, both of Urbana, Ill.

[73] Assignee: The Board of Trustees of the University of Illinois, Urbana, Ill.

[21] Appl. No.: 410,782

[22] Filed: Mar. 24, 1995

[51] Int. Cl.$^6$ .................................................. H01L 21/20
[52] U.S. Cl. ............ 117/84; 148/DIG. 3; 148/DIG. 64; 117/953; 117/88; 117/108; 438/918
[58] Field of Search .................................. 437/105, 107, 437/126, 133, 174, 175; 148/DIG. 3, DIG. 64

[56] References Cited

U.S. PATENT DOCUMENTS

| | | | |
|---|---|---|---|
| 4,190,470 | 2/1980 | Walline | 148/174 |
| 4,488,914 | 12/1984 | Quinlan et al. | 148/175 |
| 4,738,934 | 4/1988 | Johnston, Jr. et al. | 437/22 |
| 4,782,034 | 11/1988 | Dentai et al. | 437/94 |
| 4,830,982 | 5/1989 | Dentai et al. | 437/94 |
| 4,849,373 | 7/1989 | Knight et al. | 437/129 |
| 5,045,496 | 9/1991 | Hess et al. | 437/81 |
| 5,137,847 | 8/1992 | Shimakura et al. | 437/248 |
| 5,215,938 | 6/1993 | Arroyo | 437/104 |
| 5,244,829 | 9/1993 | Kim | 437/104 |
| 5,306,662 | 4/1994 | Nakamura et al. | 437/107 |

OTHER PUBLICATIONS

B.T. Cunningham, J.E. Baker, S.A. Stockman, and G.E. Stillman, *Absence of $^{13}C$ Incorporation in $^{13}CCl_4$–doped InP grown by Metalorganic Chemical Vapor Deposition*, Apr. 3, 1990, Appl. Phys. Lett. 56(18), pp. 1760–1762.

B.T. Cunningham, J.E. Baker, and G.E. Stillman, *Carbon Tetrachloride Doped $Al_xGa_{1-x}$ As Grown by Metalorganic Chemical Vapor Deposition*, Feb. 26, 1990, Appl. Phys. Lett. 65(9), pp. 836–838.

W.M. Chen, P. Dreszer, A. Prasad, A. Kurpiewski, W. Walukiewicz, E.R. Weber, E. Sorman, B. Monemar, B.W. Liang, and C.W. Tu, *Origin of n–type conductivity of low–temperature grown InP*, Mar. 13, 1994, Journal of Applied Physics, vol. 76, pp. 600–602.

Gardner et al., "Semi–insulating InP Grown at Low Temperature By Metalorganic Chemical Vapor Deposition", Applied Physics Letters, vol. 65 (3), Jul. 18, 1994 pp. 359 to 361.

*Primary Examiner*—Robert Kunemund
*Attorney, Agent, or Firm*—Greer, Burns & Crain, Ltd.

[57] ABSTRACT

A process for growing semi-insulating layers of indium phosphide and other group III–V materials through the use of halide dopant or etchant introduction during growth. Gas phase epitaxial growth techniques are utilized at low temperatures to produce indium phosphide layers having a resistivity greater than approximately $10^7$ ohm-cm. According to the preferred embodiment carbon tetrachloride is used as a dopant at flow rates above 5 sccm to grow the layers with substrate growth temperatures ranging from approximately 460° C. to 525° C. This temperature range provides an advantage over the transition metal techniques for doping indium phosphide since the high temperatures generally required for those techniques limit the ability to control growth. Good surface morphology is also obtained through the growth according to the present invention. The process may be used to form many types of group III–V semiconductor devices.

18 Claims, 4 Drawing Sheets

HALIDE DOPANT PROCESS FOR PRODUCING SEMI-INSULATING GROUP III-V REGIONS FOR SEMICONDUCTOR DEVICES

This invention was made with Government support under Contract Numbers NSF DMR 89-20538 (73) and NSF ECD 89-43166 awarded by the National Science Foundation and Contract No. DAAL 03-92-G-0272 GES awarded by the Army Research Office. The Government has certain rights in this invention.

The present invention relates generally to the production of semi-insulating layers of indium phosphide (InP) or other Group III-V compounds in semiconductor devices using gas phase growth techniques such as metal organic chemical vapor deposition (MOCVD), gas source molecular beam epitaxy (GSMBE), chemical beam epitaxy (CBE) and vapor phase epitaxy (VPE). More particularly, the present invention relates to a process for producing semi-insulating layers of InP using halide dopant sources, such as carbon tetrachloride ($CCl_4$) and carbon tetrabromide ($CBr_4$) at low growth temperatures. The halide dopant technique of the present invention results in high resistivity and is more easily implemented than typically utilized iron doping techniques for producing semi-insulating InP.

BACKGROUND OF THE INVENTION

Semiconductor integrated circuits are the fundamental building blocks of modern electronic devices. Computers, cellular phones, and consumer electronics rely extensively on these devices, which may be used for storage of, computations on, and communication of data.

The most common semiconductor devices are formed using silicon as the primary substrate substance. Layers and regions of N-type material (such as elemental silicon), P-type material, and insulative material are combined to form electronic devices and circuits. N-type material is material which includes an excess of electrons. A typical method of producing N-type material is the introduction of certain atomic impurities into the semiconductor during growth of the semiconductor substrate. When certain other atomic impurities are introduced during growth, the resulting material will generally be P-type, having "holes", i.e., a deficit of electrons. In a P-type material, the holes act as charge carriers for the flow of electricity. In an N-type material, the excess electrons act as charge carriers. An insulator material is one which has a high resistance to current flow and may be used to isolate discrete components of a circuit, and act as a substrate on which active devices may be epitaxially grown.

The arrangement of P-type, N-type, and insulative materials and the respective electrical connections to each will determine what type of electrical device is created. Transistors, diodes, capacitors and most other electrical devices are created through the arrangement of these materials in a semiconductor device.

Recently, the advantages of using the Group III-V semiconductors (semiconductors formed from compound alloys including Group III and Group V elements) instead of silicon have led to extensive research and development. Among the typically used compounds and alloys are gallium arsenide (GaAs), aluminum gallium arsenide (AlGaAs) and indium phosphide (InP). The basic designs for the transistors and other devices used in silicon-based electronic devices have been adapted to Group III-V materials. Devices made from the Group III-V materials generally require lower power and are faster (operate at higher frequencies).

Group III-V semiconductor materials may also be used to produce optoelectronic devices, such as semiconductor lasers. In such devices an active region of un-doped or low-doped semiconductor material that is sandwiched between dual layers of P-type and N-type doped materials emits coherent light in response to the application of electrical current. The light is produced when holes from the P-type material recombine with electrons from the N-type material in the active region.

Other applications of the Group III-V materials are known to those in the art and include optical detectors, high-speed amplifiers and logic circuits. The widespread substitution of these semiconductors for silicon devices is impeded by relative difficulty and expense in producing group III-V semiconductors in comparison to the silicon devices.

One of the difficulties experienced with the use of InP is the process utilized to make InP semi-insulating layers. Pure InP would have a resistivity on the order of $10^8$ ohm-cm. However, in practice inP is obtainable only with impurities which significantly decrease the resistivity.

Iron doping has been adopted as a means for increasing the resistivity of indium phosphide. Typically, a precursor (the molecule containing the desired iron atom) of iron pentacarbonyl or ferrocene is used in conjunction with MOCVD growth of epitaxial indium phosphide. High resistivity on the order of $10^9$ ohm-cm is realized through this technique.

Such iron doping techniques have a number of difficulties. One of the difficulties is recognized by Dentai et al., U.S. Pat. No. 4,782,034. That patent noted that iron doped indium phosphide layers have poor thermal stability, i.e., performance is sensitive to temperature. Addressing this problem, the Dentai patent adopts doping using a titanium-based metal-organic dopant precursor. Similar to iron doping techniques, fairly high temperature is used in the growth to decompose the precursor according to Dental, on the order of 650° C. Dentai contemplates decomposition of the titanium precursors at temperatures of up to 850° C. Temperatures on this order may induce dopant diffusion which reduces the degree of control over the location of growth of the insulating material.

Frequently, it is desirable to selectively grow a semi-insulating material on a limited area which has been etched out of another layer. The reduction in control caused by the use of high temperatures may adversely affect this ability. At high temperatures the semi-insulating material has a tendency to cover the entire layer onto which it is being grown instead of only the desired etched-out areas. In other words, the doped indium phosphide grown at the higher temperatures may lay a blanket over the entire layer upon which it is being grown.

Another problem encountered in the use of iron doping techniques relates to the tendency of iron to remain reactive and migrate through subsequently grown layers. As subsequent layers are grown upon an iron doped indium phosphide layer acting as a substrate, for instance, the iron diffuses through the subsequently grown layers, and contaminates them.

Further difficulties may arise from the nature of the precursors used for iron doping techniques. The aforementioned ferrocene and iron pentacarbonyl leave behind a residue in the apparatus used to grow the InP. The sealed chamber used for iron-doped InP growth may actually have such residue absorbed in to the chamber walls. The residue then may act as a contaminant during further growth in the chamber. Thus, a separate crystal growth chamber system is sometimes dedicated to the growth of the iron-doped indium phosphide. This is expensive since the growth system may cost hundreds of thousands of dollars.

Indium phosphide is normally an N-type material. The effects of carbon tetrachloride doping to create P-type indium phosphide at conventional growth temperatures of 580° and 630° C. have been investigated. Cunningham et al, "Absence of $^{13}C$ Incorporation in $^{13}CCl_4$—Doped InP Grown by Metalorganic Chemical Vapor Deposition", Applied Physics Letters 56 (18), pp. 1760–62, Apr. 30, 1990. Because carbon acts as an acceptor of electrons in other group III–V materials, such as gallium arsenide, Cunningham tested whether a carbon source like carbon tetrachloride could be used to produce P-type indium phosphide, the carbon accepting excess electrons present in the indium phosphide. The work by Cunningham found that doping with carbon at conventional growth temperatures of 580° and 630° resulted in no measurable change in carbon concentration and no change in carrier concentration. This suggests that the material grown at these conventional temperatures remained slightly N-type. The lack of carbon incorporation was attributed to the relatively weak bond formed between indium and carbon, the bond being broken at higher growth temperatures. The conclusion reached was that carbon was an impractical P-type dopant in indium phosphide and that extremely low growth temperatures below 450° C. would be necessary to achieve any significant carbon incorporation. Later work of others suggested that carbon acts as a donor, or N-type dopant, in indium phosphide and would logically produce more severely N-type material.

However, at those temperatures below 450°, such as growth at 425°, carbon tetrachloride doped indium phosphide exhibits poor surface morphology. Morphology is the texture of the surface, which ideally should be mirror-like. Poor morphology makes it difficult to add successive layers of semiconductor material. In all, there is a need for methods which control the doping of InP to create high resistance in isolated regions of the substrate, without chamber contamination or poor surface morphology.

Accordingly, an object of the present invention is to provide an improved process for producing semi-insulating indium phosphide.

Another object of the invention is to provide an improved process for producing semi-insulating indium phosphide and other Group III–V compounds having resistivity exceeding approximately $10^7$ ohm-cm.

Yet another object of the invention is to provide an improved process for producing semi-insulating indium phosphide and other Group III–V compounds through use of precursors which will not contaminate a growth chamber in which the semiconductor is grown.

A further object of the invention is to provide an improved process for producing semi-insulating indium phosphide and other Group III–V compounds by using halide dopants, such as carbon tetrachloride and carbon tetrabromide at growth temperatures ranging from approximately 450° C. to 525° C.

A still further object of the invention is to provide an improved process for producing semi-insulating indium phosphide which allows practical incorporation of the indium phosphide into many semiconductor devices, for uses such as an insulating gate layer for metal-insulator-semiconductor field effect transistors (MISFETs), as a buffer layer to eliminate the effects of the Si impurity spike found at the epilayer/substrate interface on the pinch-off characteristics of InP field-effect transistors (FETs), as a current blocking layer in semiconductor lasers, as a device isolation layer in optoelectronic integrated circuits and as a Schottky-barrier enhancement layer for indium gallium arsenide based devices.

SUMMARY OF THE INVENTION

In keeping with one aspect of the invention, a method is presented for growing semi-insulating indium phosphide at low temperatures through gas phase growth techniques. The method includes a step of introduction of a tetrahalide dopant precursor during growth of indium phosphide in a growth chamber. Preferably, the precursor dopant utilized is carbon tetrachloride, but other halide precursors or etchants having similar properties may produce similar results, such as carbon tetrabromide and carbon tetraiodide.

In accordance with another aspect of the present invention, the growth during doping may be carried out at temperatures ranging approximately from 460° C. to 525° C. for MOCVD. Other growth techniques may utilize a different range, with any likely useful range being lower than conventionally used growth temperatures. Layers of halide doped indium phosphide grown in accordance with the present invention exhibit good surface morphology while allowing for control over the growth of the indium phosphide layer. The growth may be predictably confined, for instance, to etched out regions of other layers. As such, semiconductor devices with semi-insulating regions of indium phosphide and other Group III–V compounds may be produced according to the present invention.

BRIEF DESCRIPTION OF THE DRAWINGS

Other objects, features and advantages of the present invention will be apparent to those skilled in the art through the following description and drawings, in which.

DETAILED DESCRIPTION OF THE INVENTION

Referring now to FIGS. 1–6, the principles of the present invention will be illustrated in more detail. The description is based upon exemplary growth of samples in accordance with the principles of the present invention.

The particular method utilized to grow the exemplary samples was low pressure metalorganic chemical vapor deposition (LP-MOCVD). However, artisans will appreciate that similar gas phase techniques may be utilized, such as VPE, GSMBE, CBE, and MOMBE. The samples described herein were grown in an EMCORE GS3100 LP-MOCVD reactor at a pressure of 76 Torr. Indium phosphide growth precursors of TMIn (In(CH$_3$)$_3$) and pure PH$_3$ were utilized.

The dopant used to supply the halide in the exemplary samples was carbon tetrachloride CCl$_4$ supplied at 2000 ppm in hydrogen. Based upon the results described herein the increase in resistivity appears to be attributable indirectly to an etching effect induced by the introduction of the chlorine. As other halides exhibit properties similar to chlorine, use of other halides or etchants is contemplated as within the scope of the present invention. For example, dopant sources of carbon tetrabromide CBr$_4$, carbon tetraiodide CI$_4$, and hydrogen chloride HCl should produce similar results. While CCl$_4$ is a readily available source, advantages might also be realized through the use of CBr$_4$ since the latter substance is not subject to all of the environmental regulations to which the former is subjected.

Similarly, the exemplary results suggest that the etchant effect may be induced in other Group III–V materials at lower than normal growth temperatures. Thus, the production of semi-insulating layers of other group III–V compounds through halide or etchant introduction is also contemplated as within the scope of the present invention.

Figure 1:
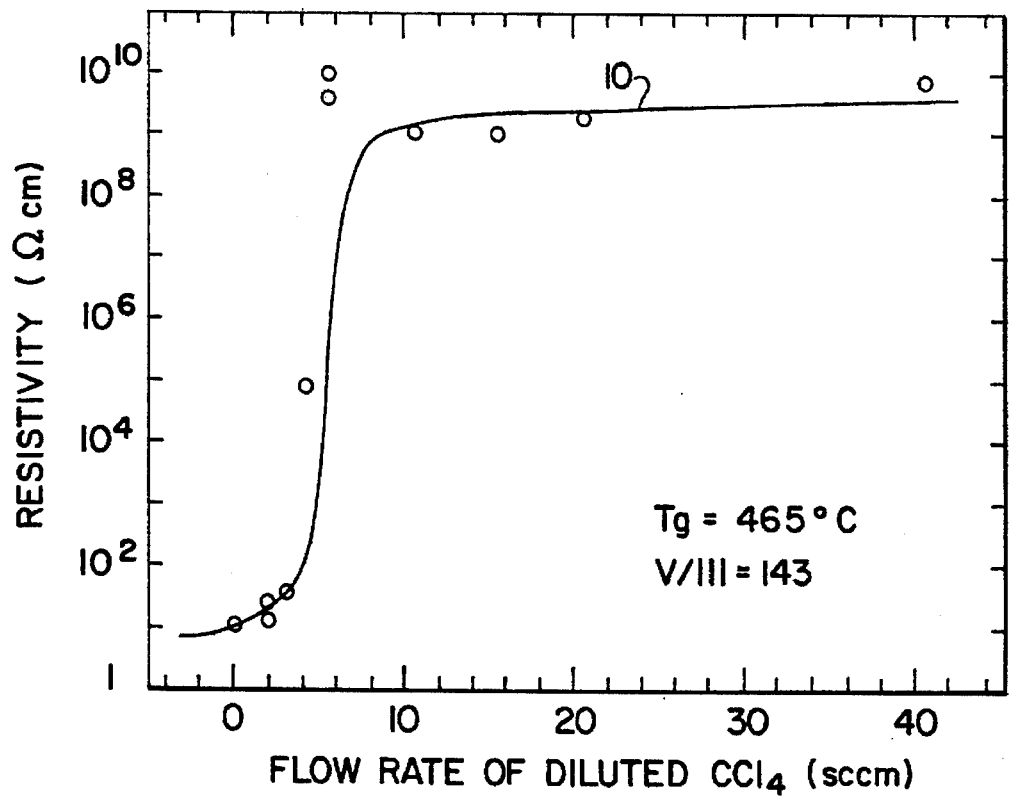
FIG. 1 shows a plot of resistivity versus carbon tetrachloride flow rate for carbon tetrachloride doped indium phosphide samples grown according to the present invention.

Referring now to FIG. 1, illustrated is the resistivity of InP samples for various flow rates of CCl$_4$. The curve 10 approximately follows the resistivity for samples grown at 465° C. over CCl$_4$ flow rates varying from 0 standard cubic centimeters per minute (sccm) to approximately 40 sccm. The ratio of group V elemental concentration to group III elemental concentration was approximately 143.

Readily apparent from the curve 10 is the strong effect that the flow rate of CCl$_4$ has on the resistivity of the InP. At flow rates below 4 sccm the indium phosphide layer grown is slightly N-type. However, a sudden change is induced at flow rates of approximately 5 sccm or higher. For layers of InP grown under those conditions the resistivity is approximately $10^9$ ohm-cm.

The growth rate of the layer is also strongly affected by the flow rate of CCl$_4$. The samples grown at a flow rate of 0 sccm exhibited an approximate growth rate of 300 Å per minute. As the flow rate is increased the growth rate decreases. The sample grown with a flow rate of 40 sccm exhibited a growth rate of approximately 175 Å per minute. The lowering of the growth rate is likely attributable to the etching of the InP by the halide Cl.

Surface morphology of the epilayers grown at 465° C. was excellent. Under Nomarski microscopy, the layers appeared mirror-like. Moreover, the morphology seemed to improve as the flow rate was increased. This phenomenon is also likely attributable to etching by the Cl, which would increase at the higher flow rates thereby producing a smoother growth surface.

Figure 2:
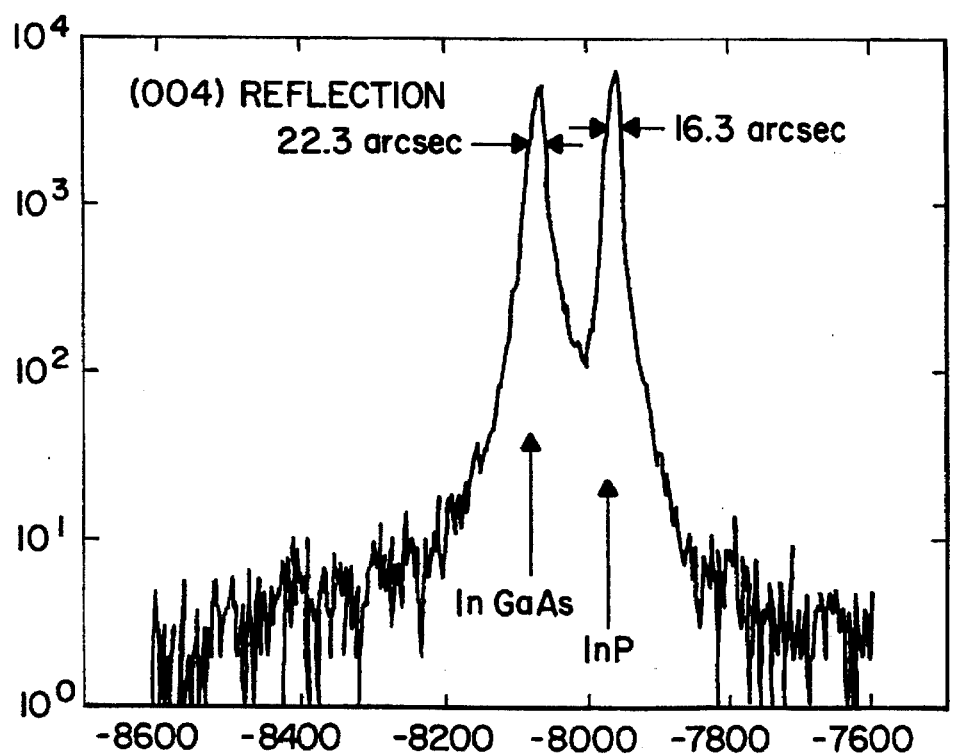
FIG. 2 shows a double-crystal x-ray diffraction measurement plot for an indium gallium arsenide layer grown on a carbon tetrachloride doped indium phosphide layer grown according to the present invention.

Referring now to FIG. 2, determination of the composition and crystallanity of the doped InP layers indicate that the InP is epitaxial, single-crystalline and suitable for use as a buffer layer. The (004) diffraction peak of an undoped In$_{0.53}$Ga$_{0.47}$As 1 μm layer grown on a 2000 Å thick CCl$_4$ doped InP layer has a full width at half maximum (FWHM) of 22 arcsec (as is illustrated in FIG. 2) which is similar to InGaAs grown directly on InP substrates. The clearly epitaxial InGaAs layer demonstrates that the doped InP is suitable for use as a buffer layer.

Figure 3:
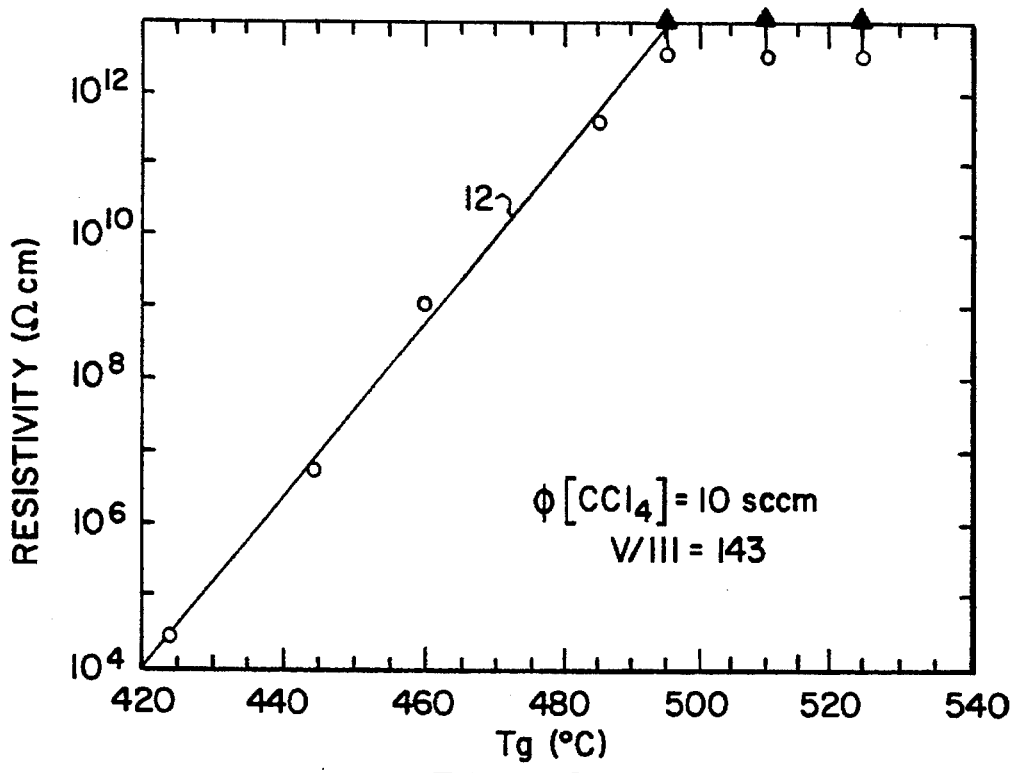
FIG. 3 shows a plot of resistivity versus substrate temperature for samples grown according to the present invention.

Similarly to flow rate, substrate temperature during growth also plays a role in the resistivity of the doped InP layers grown in accordance with the present invention. FIG. 3 illustrates the resistivity obtained for layers grown at various substrate temperatures. For these samples the CCl$_4$ flow rate was maintained at approximately 10 sccm and the group V/III ratio at 143. The flow rate is well within the range producing the good resistivity illustrated in FIG. 1. The generally straight line 12 follows the resistivity for layers grown with a substrate temperature varying from 425° C. to 485° C., with points up to 525° C. being clearly resistive. As is apparent from the line 12, the resistivity for layers grown below 450° is poor for use as semi-insulating material, while the resistivity grown above that range is good. The range of resistivity shown varies from approximately $10^4$ ohm-cm at 425° C. to greater than $10^{12}$ ohm-cm at 485° C. and above. Other growth techniques, such as beam epitaxy techniques may alter the temperature range at which good resistivity is obtained.

FIG. 3 includes points that are not on the line 12, and are marked with arrows. These three points, representing layers grown at temperatures above 485° C., indicate that the resistivity of these layers was too large to measure using the measurement technique employed. The resistivity was measured by fabricating a device consisting of an n-type InP Substrate (450μ thick), with a 1μ-thick layer of CCl$_4$-doped InP grown on top, followed by a 0.5μ-thick N-type layer. InP layer cylindrical regions of 200μ diameter were chemically etched into this semiconductor structure, and the current flow vertically through the cylindrical region was measured with a voltage applied to the two N-type layers. The instrumentation used to measure the current flow restricts the range of measurable resistivities to less than $10^{12}$ ohm cm.

The line 12 includes data points below 450° C., for which the resistivity is below $10^7$ ohm-cm. Surface morphology is also problematic at the low end of the line 12. Unlike the samples grown at 465° and plotted in FIG. 1, the sample grown at 425° C. exhibited poor surface morphology. Thus, attempts to incorporate significant carbon through CCl$_4$ doping by growing at temperatures well below 450° C., as per Cunnigham, *Applied Phys. Lett.* 56, results in layers poorly suited for epitaxial structures.

However, the proposition that carbon incorporation decreases as temperature increases is reflected by the samples grown in accordance with present invention at various temperatures. The decrease in carbon incorporation indicates that responsibility for the increase in resistivity is attributable, at least indirectly, to the introduction of the chlorine during growth.

Figure 4:
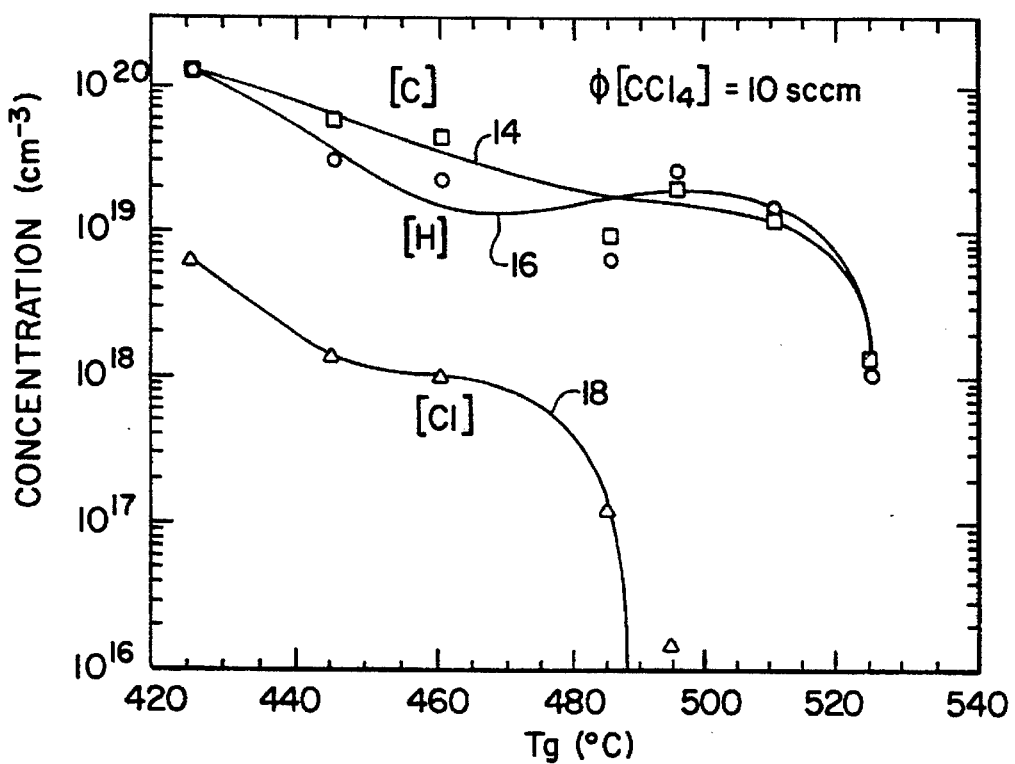
FIG. 4 shows a plot of carbon, hydrogen and chlorine concentrations versus substrate temperature for samples grown according to the present invention.

Referring now to FIG. 4, the respective concentrations of carbon, hydrogen, and chlorine as measured by secondary ion mass spectrometry are plotted versus substrate growth temperature. Conditions for growth of the samples were identical to those for the plot of FIG.3, with the flow rate of CCl$_4$ at 10 sccm and the substrate temperature varying from 425° C. to 525° C. The curve 14 tracks carbon concentration, the curve 16 hydrogen concentration and the curve 18 chlorine concentration. The incorporation of each of the elements decreases significantly as temperature is increased. A clear reason for the increased resistance is not readily apparent from this plot.

Figure 5:
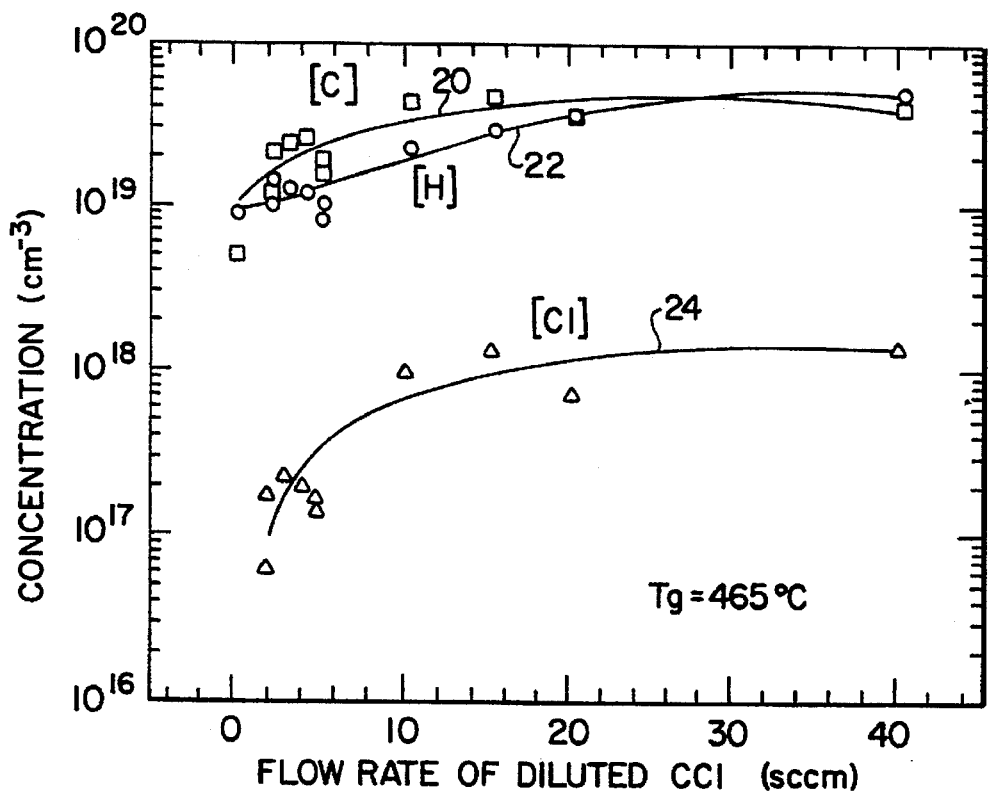
FIG. 5 shows a plot of carbon, hydrogen and chlorine concentrations versus the flow rate of carbon tetrachloride for samples grown according to the present invention.

More helpful is the plot of the same elemental concentrations versus CCl$_4$ flow rate, as shown in FIG. 5. Carbon, hydrogen and chlorine concentrations are respectively represented by the curves 20, 22 and 24. Conditions for growth of the samples plotted in FIG. 5 are identical to those of FIG. 1, with a substrate temperature of 465° C. and a flow rate of CCl$_4$ varying from 0 to 40 sccm.

Carbon and hydrogen incorporation in the sample grown at 0 sccm likely results from the incomplete disassociation of the InP growth precursor TMIn ($In(CH_3)_3$) at low temperatures. The variation of carbon and hydrogen incorporation remains somewhat static over the various flow rates, as evidenced by the generally flat nature of the respective concentration curves 20 and 22.

In contrast, the increase in chlorine concentration for flow rates of approximately 5 sccm and above increases dramatically. Referring again to FIG. 1, when the same flow rate threshold is reached and surpassed, resistivity increases dramatically. Considering FIGS. 1 and 5 together shows that Cl concentration increases by an order of magnitude from $10^{17}$ to $10^{18}$ and resistivity increases from approximately $10^1$ to $5 \times 10^9$ as the flow rate is increased from 2 to 10 sccm.

Figure 6:
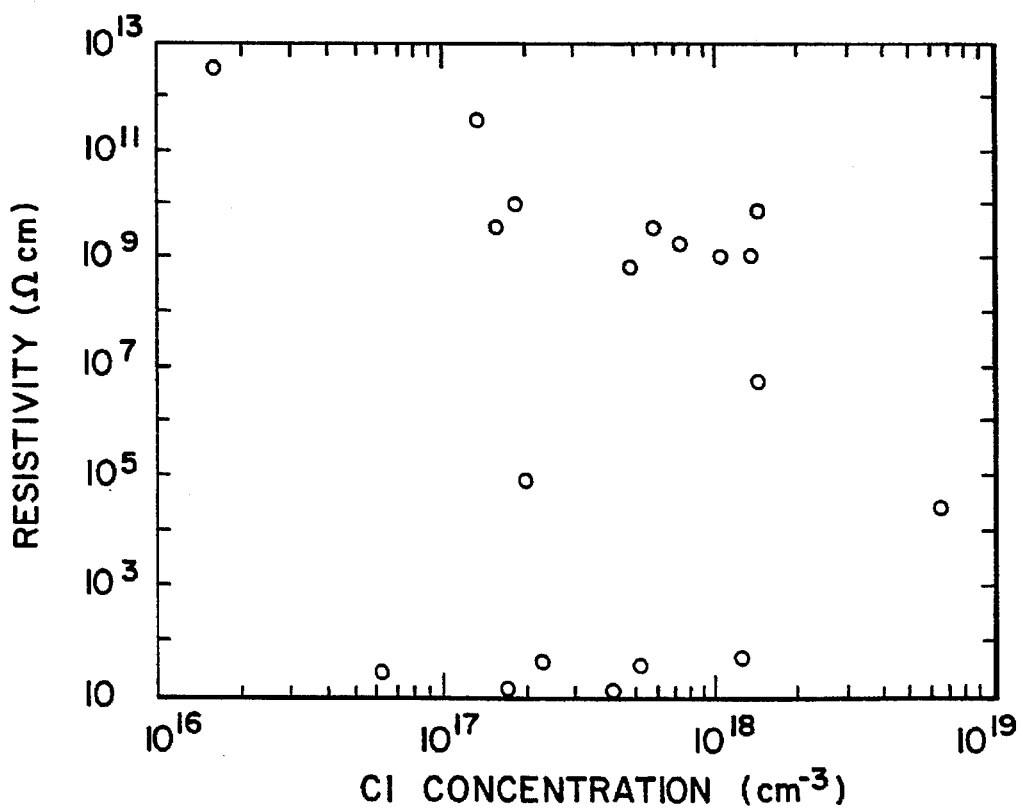
FIG. 6 shows a plot of resistivity versus chlorine concentration for samples grown according to the present invention.

This apparent direct correlation between chlorine concentration and resistivity suggested by FIG. 5 is not supported by other data. FIG. 6 plots resistivity versus chlorine concentration for all of the samples grown at various temperatures and flow rates, and shows no correlation between the two quantities.

The rapid increase in resistivity with increase in chlorine concentrations at low $CCl_4$ flow rates suggests that chlorine introduces a deep level in the InP. Taken together with the lack of direct correlation between chlorine concentration and resistivity, as illustrated in FIG. 6, and the substrate temperature effect on resistivity illustrated in FIG. 3, there is a stronger indication that a native defect is responsible for the semi-insulating behavior of the doped InP. If this is accurate, the incorporation of the defect may increase as growth temperature rises. Of course, the ability to control the growth of the doped InP layer is enhanced at lower growth temperatures. For these reasons, it is advantageous to grow the semi-insulating layers at the lower temperatures which still produce sufficient resistance.

Thus, the use of other halides and etchants should produce similar results in InP and other group III–V compounds. In the other group III–V compounds the halide or etchant should not come from a carbon compound since the carbon acts as an acceptor in other group III–V compounds thereby making P-type material. In InP, a broad range of halide containing molecules, including the organic molecules may likely be used to produce semi-insulating layers.

At lower than conventional growth temperatures, the presence of the halide element during growth of group III–V semiconductors seems to act as an etchant which introduces deep level defects. For growth at conventional temperatures (such as the 580° for MOCVD InP growth by Cunningham) the defect may be cured during growth. For this reason, halide or etchant introduction at lower then conventional growth temperature should produce semi-insulating material in many group III–V compounds.

Figure 7:
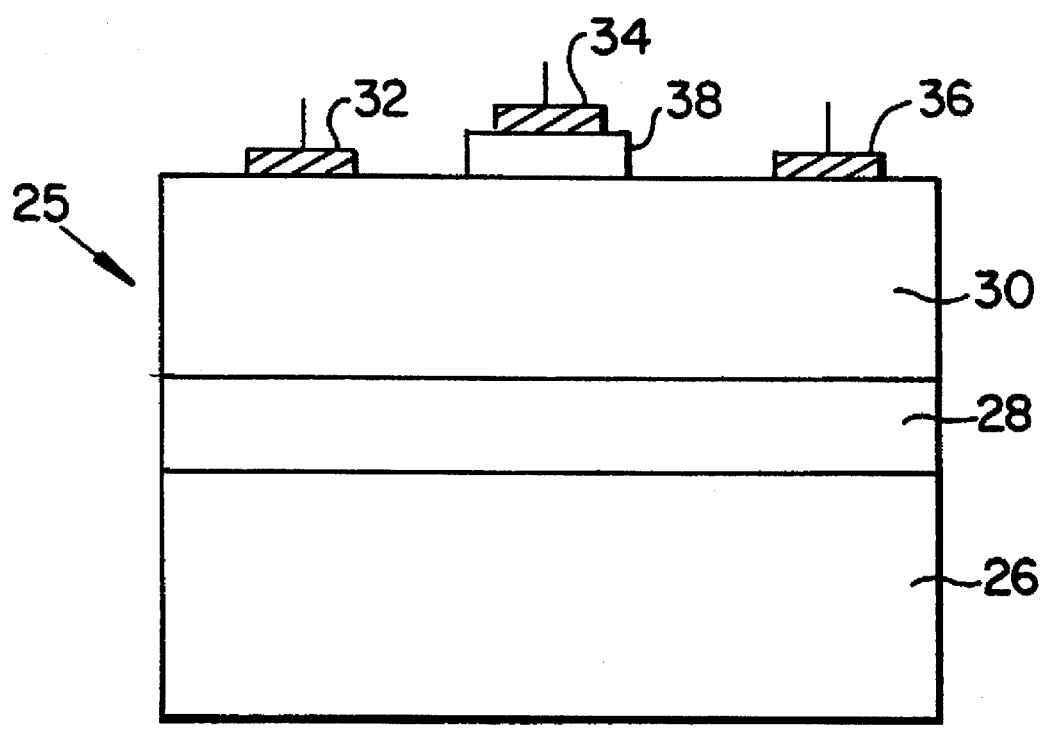
FIG. 7 shows a MISFET device grown in accordance with the present invention.

Referring now to FIG. 7, a MISFET 25 grown in accordance with the present invention is shown. The device is an example of the many known structures which could be grown according to the present invention. A substrate 26 may be formed of InP, for instance. Grown on the substrate, in accordance with the present invention, is a tetrahalide doped InP buffer epilayer 28. An active channel region 30 may be formed of P-type or N-type group III–V material. Contact metallizations 32, 34 and 36 respectively form the source, gate and drain of the transistor 25. A gate insulation region 38 is also formed of semi-insulating InP grown according to the present invention. Use of the InP regions 28 and 38 grown in accordance with the present invention provides excellent isolation without control and contamination problems during growth.

While a particular embodiment of the present invention has been described, it will be appreciated by those skilled in the art that changes and modifications may be made thereto without departing from the invention in its broader aspects and as set forth in the following claims. Layers grown in accordance with the present invention are readily applicable to many well known semiconductor devices.

What is claimed is:

1. A method for growing semi-insulating group III–V regions for a semiconductor device comprising the steps of:

introducing gaseous group III–V precursors into a growth reactor chamber having a substrate; and introducing a gaseous halide dopant into said growth reactor chamber along with said group III–V precursors to produce semi-insulating group III–V regions.

2. A method for growing semi-insulating group III–V regions according to claim 1, wherein said group III–V precursors are indium phosphide precursors.

3. A method for growing semi-insulating group III–V regions in accordance with claim 2 wherein:

said indium phosphide precursors and said halide dopant react to form indium phosphide having a resistivity exceeding approximately $10^7$ ohm-cm.

4. A method for growing semi-insulating group III–V regions in accordance with claim 2 wherein said substrate is maintained at a temperature of approximately 460° C.–525° C.

5. A method for growing semi-insulating group III–V regions in accordance with claim 4 wherein:

said halide dopant is carbon tetrachloride.

6. A method for growing semi-insulating group III–V regions in accordance with claim 4 wherein:

said halide dopant is carbon tetrabromide.

7. A method for growing semi-insulating group III–V regions in accordance with claim 4 wherein:

said halide dopant is carbon tetraiodide.

8. A method for growing semi-insulating group III–V regions in accordance with claim 5 wherein:

said carbon tetrachloride is introduced at a flow rate in excess of approximately 5 standard cubic centimeters per minute.

9. A method for growing semi-insulating indium phosphide for use in a semiconductor structure including a substrate, N or P type regions, and isolation regions formed of said semi-insulating indium phosphide comprising the steps of:

heating a substrate in a growth reactor chamber;

introducing gaseous indium phosphide precursors into said growth reactor chamber after said substrate has been heated;

introducing a gaseous halide dopant into said growth reactor chamber along with said indium phosphide precursors; and continuing the introduction of said indium phosphide precursors and said halide dopant to form a region of semi-insulating halide doped indium phosphide.

10. A method for growing semi-insulating indium phosphide in accordance with claim 9 wherein:

said indium phosphide precursors and said halide dopant react to form indium phosphide having a resistivity exceeding approximately $10^7$ ohm-cm.

11. A method for growing semi-insulating indium phosphide in accordance with claim 9 wherein said predetermined temperature is within a range of approximately 460° C.–525° C.

12. A method for growing semi-insulating indium phosphide in accordance with claim 11 wherein:

said halide dopant is carbon tetrachloride.

13. A method for growing semi-insulating indium phosphide in accordance with claim 11 wherein:

said halide dopant is carbon tetrabromide.

14. A method for growing semi-insulating indium phosphide in accordance with claim 11 wherein:

said halide dopant is carbon tetraiodide.

15. A method for growing semi-insulating indium phosphide in accordance with claim 12 wherein:

said carbon tetrachloride is introduced at a flow rate in excess of approximately 5 standard cubic centimeters per minute.

16. A method for growing semi-insulating group III–V regions for a semiconductor device comprising the steps of:

introducing gaseous group III–V compound precursors into a growth reactor chamber having a substrate; and introducing a gaseous etchant into said growth reactor chamber along with said group III–V precursors to produce semi-insulating group III–V regions.

17. A method for growing semi-insulating indium phosphide in accordance with claim 16 wherein:

said group III–V precursors and said etchant react to form indium phosphide having a resistivity exceeding approximately $10^7$ ohm-cm.

18. A method for growing semi-insulating indium phosphide in accordance with claim 17 wherein said substrate is maintained at a temperature in the approximate range of 460° C.–525° C.

* * * * *